United States Patent [19]
Milstein et al.

[11] Patent Number: 5,688,318
[45] Date of Patent: Nov. 18, 1997

[54] PHOTONIC BAND GAP MATERIALS AND METHOD OF PREPARATION THEREOF

[76] Inventors: Joseph B. Milstein, 134 Foster St., Brighton, Mass. 02135; Ronald G. Roy, 15 Guile Ave., Tewksbury, Mass. 01876

[21] Appl. No.: 468,971

[22] Filed: Jun. 6, 1995

Related U.S. Application Data

[62] Division of Ser. No. 266,146, Jun. 27, 1994, which is a division of Ser. No. 986,848, Dec. 4, 1992, Pat. No. 5,385,114.

[51] Int. Cl.$^6$ ................................................. C30B 33/06
[52] U.S. Cl. ........................... 117/1; 437/126; 437/129
[58] Field of Search .................... 117/1, 54, 74, 117/75, 81, 87, 95; 437/127, 126, 129; 372/39, 43

[56] References Cited

U.S. PATENT DOCUMENTS

| | | | |
|---|---|---|---|
| 3,826,625 | 7/1974 | Bailey | 23/301 |
| 4,902,656 | 2/1990 | Erkens | 501/153 |
| 5,335,240 | 8/1994 | Ho et al. | 372/39 |
| 5,365,541 | 11/1994 | Bullock | 372/99 |
| 5,385,114 | 1/1995 | Milstein et al. | 117/1 |

*Primary Examiner*—Felisa Garrett

[57] ABSTRACT

The invention concerns materials which exhibit photonic band gaps in the near infrared and visible regions of the optical spectrum and methods of preparation of such materials.

1 Claim, 1 Drawing Sheet

PHOTONIC BAND GAP MATERIALS AND METHOD OF PREPARATION THEREOF

This is a division of application Ser. No. 08/266,146 filed 27 Jun. 1994, which was itself a division of application Ser. No. 07/986,848, filed 4 Dec. 1992, now U.S. Pat. 5,385,114, issued 31 Jan. 1995.

BACKGROUND OF THE INVENTION

1. Field of the Invention

The present invention relates to photonic band gap (PBG) materials and method and means of preparation of the same. A definition of the concept of a photonic band gap material is in order, and may be stated as follows. In direct conceptual analogy to the appearance of an electronic band gap in a semiconductor material, which excludes the possibility that electrical carriers can have stationary energy states within the band gap, one can theoretically postulate the appearance of a photonic band gap in a dielectric medium in which the possibility of stationary photonic energy states (i.e., electromagnetic radiation having some discrete wavelength or range of wavelengths) must be rigorously excluded in that band gap. In semiconductors, the electronic band gap results as a consequence of having a periodic atomic structure upon which the quantum mechanical behavior of the electrons in the material must attain eigenstates. By analogy, the photonic band gap results if one has a periodic structure of a dielectric material where the periodicity is of a distance suitable to interact periodically with electromagnetic waves of some characteristic wavelength that may appear in or be impressed upon the material, so as to attain quantum mechanical eigenstates.

In particular, one class of uses of these materials that can be envisioned, but which so far has not been practically demonstrated, is the optical analog to semiconductor behavior, in which a photonic band gap material, or a plurality of such materials acting in concert, can be made to interact with and control light wave propagation in a manner analogous to the way that semiconductor materials can be made to interact with and control the flow of electrically charged particles, i.e., electricity, in both analog and digital applications.

2. Description of the Prior Art

A review of possible applications of these materials is presented by Henry O. Everitt in an article entitled, "Applications of Photonic Band Gap Structures", in Optics add Photonics News, volume 3, number 11, pages 20–23, which was published in November, 1992.

Prior descriptions of photonic band gap materials and methods of preparation of these materials include those of Eli Yablonovitch and co-workers, which have appeared in articles in the scientific journal Applied Physics Letters. These authors have demonstrated that the concept of a photonic band gap material is valid, but have only shown this behavior in the microwave region of the electromagnetic spectrum. They discuss conceptual methods of manufacturing such materials, which rely on the removal of predetermined volumes of material from a solid mass of a uniform material.

These prior inventions have never been applied in commercial practice, but have been described in the scientific literature only, as far as we have been able to determine.

We will present an example which demonstrates the superiority of the present invention over the prior art in photonic band gap materials. The major applications of photonic band gap materials are likely to be in the areas of the use and control of electromagnetic radiation in the wavelength range extending from the millimeter or microwave region to the ultraviolet region. The prior descriptions of methods that may be employed to fabricate such materials typically involve the mechanical drilling or machining of holes or cavities of macroscopic dimensions (of the order of millimeters or tenths of millimeters) in solid blocks of a dielectric material, or the concept of using physically directed and orientationally controlled chemical removal such as reactive ion etching to fabricate holes or cavities having dimensions of the order of microns in solid blocks of a dielectric material. These procedures suffer from the disadvantages that they are time consuming, expensive to perform, and require sophisticated and expensive machinery for their practice. Everitt, in the November 1992 publication cited above, states on page 23:

"However, a number of issues must be addressed before the crystals can live up to expectations. Fabrication difficulty increases with increasing band gap frequency. Materials with high real dielectric constants and low loss tangents must be identified for all frequency regions. Theories describing pure and doped PBG crystals must be refined and optimal structures identified. Finally the intolerance of the crystals to imperfections and the lack of post-fabrication gap/defect tunability are practical concerns an experimenter must face.

Nevertheless, given that PBG crystals were first proposed five years ago and demonstrated only last year, researchers are optimistic that these obstacles can be mitigated. For the interested reader, a more in-depth survey of current activity involving PBG crystals and their potential applications may be gleaned from an upcoming issue of JOSA B dedicated to the "Development and Application of Materials Exhibiting Photonic Band Gaps," (February 1993)."

JOSA B refers to the Journal of the Optical Society of America, part B.

Our invention Provides a solution to these problems, and is, as far as we can determine, the first to demonstrate photonic band gap behavior in the near infrared and visible portions of the electromagnetic spectrum.

In addition, we have discovered other new details of construction, which, when taken together, permit our invention to achieve results which the previously disclosed technologies are not capable of achieving. These discoveries will be stated explicitly in the discussion of the invention.

Yablonovitch et. al. teaches a method and means for the construction of a photonic band gap material in Applied Physics Letters volume 67, number 17, pages 2295 to 2298, published on Oct. 21, 1991, in which it is stated, on page 2296:

"A slab of material is covered by a mask containing a triangular array of holes. Three drilling operations are conducted through each hole, 35.26° off normal incidence and spread out 120° on the azimuth. The resulting crisscross of holes below the surface of the slab provides a fully three-dimensional periodic fcc structure, with WS unit cells . . . The drilling can be done with a real drill bit for microwave work, or by reactive ion etching to create an fcc structure at optical wavelengths. We have fabricated such crystals in the microwave region by direct drilling into a commercial, low-loss, dielectric material, Emerson and Cumming Stycast-12. Its microwave refractive index, n~3.6, is meant to correspond to the that of the common semiconductors, Si, GaAs, etc. By simply scaling down the dimensions, this structure can be employed equally well at optical wavelengths."

In an article entitled "Photonic Band Gaps", published in the August, 1992 issue of Physics World, pages 37 to 42, Philip St. J. Russell states, (page 37), "Despite the difficulties of designing and constructing the right kind of structure, and of detecting what happens, Yablonovitch's team have observed a PBG at microwave frequencies in a specially drilled dielectric material (microwave refractive index of 3.6) with a face-centered-cubic lattice. This "dielectric crystal" was produced by drilling evenly spaced (8 mm pitch) sets of holes at three carefully chosen angles. To obtain a band gap at optical frequencies requires a very much smaller lattice spacing (~400 nm for 1.5 µm light in GaAs) and is much more challenging to produce. Although techniques involving reactive ion beam etching are being actively developed, no success has yet been reported."

Since Yablonovitch's device is fabricated by the removal of a selected portion of the slab of the starting material, it is clear that the present invention differs significantly and qualitatively from the device of Yablonovitch with regard to its underlying principles of fabrication. Each of the prescriptions in Yablonovitch's papers is based specifically on this geometry and method of construction, in which the structure is fabricated from a solid slab of the starting material from which material is removed.

A second type of structure having holes or pores has also been fabricated by an etching process applied to single crystal silicon. Recently, L. T. Canham at the Royal Signals and Radar Establishment (RSRE) in the United Kingdom reported the ability of anodized crystalline silicon ("porous" silicon) wafers to emit light in the visible under illumination, with no electrical contacts attached (Applied Physics Letters 57, 1046 (1990)). This result, which has been confirmed by other groups, is not well understood but is reproducible. It appears to depend on the fabrication of "quantum wires", having diameters measured in nanometers and lengths of some microns. According to RSRE, electrochemical and chemical dissolution are used to etch a thin layer of free-standing wires in the surface of bulk silicon wafers. While this etching process is not yet understood, it produces these wires rather than merely removing some thickness of silicon in a uniform manner. The dimensions of the wires may be related to the wavelength of the light which is emitted. Under the action of a blue (488 nm) laser, in excess of one percent of the incident light can be emitted in the green, while under green laser light emission in the red is observed. Both of these findings suggest that relatively high absorption efficiency should be possible. Some of these results have appeared in the literature.

In contradistinction to Yablonovitch and to Canham, we have discovered that it is possible to fabricate a photonic band gap material by impregnating the pores or voids contained within the volume of a specially prepared reticulated mesh, which may be made of a material with a high melting temperature such as a metal, with liquid material which melts at a temperature lower than the melting temperature of the reticulated mesh and which solidifies upon cooling. The reticulated mesh is then dissolved by simple chemical action in a liquid bath, leaving behind a solid reticulated structure composed of the solidified liquid material. In particular, the liquid material may be caused to solidify into an ordered solid such as a single crystal by the imposition of either or both a thermal gradient or a seed single crystal of the same or a closely related material. Rather than being a subtractive process, such as those of Yablonovitch or Canham, in which material is removed from a single mass, our process is an additive process in which a structure is produced by solidifying or adding material to form a structure. A template can be employed which may or may not be removed, as may be required, after the additive process is carried out.

Many embodiments of the present invention can be envisioned. In one instance, the material can be made as a reticulated single crystal of a material having a high dielectric constant, such as sapphire. In another instance, the material could be made as a polycrystalline reticulated solid of a material having a high dielectric constant. Other embodiments could be made from a reticulated single crystal of doped material having high dielectric constant, such as ruby (sapphire doped with chromium in 3+ oxidation state) or titanium-doped sapphire, both of which are in themselves laser materials. Yet other embodiments could be made from reticulated doped glass, such as neodymium doped glass, which is also a laser material. Yet further embodiments of the invention can be recognized in which a second material, having a second, different dielectric constant and different optical behavior, is introduced into the voids of the reticulated solid material. Still further embodiments can be suggested which may consist of reticulated bodies of material having high dielectric constant with pore sizes of dimensions significantly larger or smaller than approximately 10 microns, for example in the range of approximately 200 microns to approximately 1 micron or perhaps less, if the reticulated metal structures can be made, for example by the freezing of electrohydrodynamically generated droplets or mist. Yet further embodiments can be pointed out, as regards the means of impregnation of the fluid into the reticulated template solid, which can include capillary action, as when a liquid such as water is blotted up by tissue paper, or which can include a pressure differential, as when a gas is allowed to fill a volume, either by raising the pressure at the entry or diminishing the pressure at the exit, or a combination of both.

In addition, photonic band gap materials and devices constructed according to the prescriptions given in the present invention may be used in optical equipment and machines of more advanced design than those manufactured previously.

SUMMARY OF THE INVENTION

A specific example which we have investigated is the fabrication of a sapphire photonic band gap material in single crystal form, having continuous pores of an average size of approximately 10 micrometers in diameter as measured by scanning electron microscopy. This material was generated by infusion of liquid aluminum oxide by capillary action into a reticulated cylindrical body of tungsten, permitting the aluminum oxide to solidify, and etching away the tungsten body in a solution consisting of a mixture of aqueous hydrofluoric and nitric acids. A reticulated aluminum oxide (sapphire) body resulted which behaved as a photonic band gap material in the near infrared and visible portion of the electromagnetic spectrum. This reticulated body can be thought of as the three dimensional "negative" of the tungsten reticulated body, in that it has continuous pores where the tungsten was solid, and is solid where the tungsten had continuous pores.

The photonic band gap was observed as follows. The reticulated sapphire body was subjected to heating by the flame of a gas (hydrogen-oxygen) torch in a daylight environment. At room temperature, the reticulated sapphire body was white in color, similar to white chalk used for writing on a chalkboard. As the temperature of the body was increased by the flame, it suddenly became black in color. It remained black in color for some time until the temperature was raised by an amount, at which time it began to glow with a reddish to orange color. Upon cooling, the body again suddenly changed in color from reddish or orange to black, and finally after some time again changed suddenly to white as it came down to room temperature. One notes that black is the response observed in the absence of light. This optical behavior is completely consistent with the expected behavior of a photonic band gap material having its optical band gap in the near infrared to visible portion of the electromagnetic spectrum.

The optical behavior can be explained as follows. It is well known from quantum physics that any solid object radiates electromagnetic radiation according to Planck's Law of Radiation, which states that the intensity of radiation emitted as a function of wavelength and the body's temperature is proportional to the quantity, Q1, $$Q1 = (2\Pi hc^2)/[\lambda^5 \{exp^{(hc/\lambda kT)} - 1\}]$$

where $\pi = 3.14159\ldots$
$h = $ Planck's constant $= 6.62517 \times 10^{-27}$ erg-sec
$c = $ speed of light $= 2.99793 \times 10^{10}$ centimeter/sec k=Boltzmann's constant=$1.38044 \times 10^{-16}$ erg/degree
$\lambda$=wavelength
T=temperature in Kelvin and the wavelength at which the maximum radiation intensity occurs as a function of temperature is given by $\lambda A_{max}$
where
$\lambda_{max}$=hc/(4.965kT)=0.2897/T centimeters with h, c, k, and T as above.

Hence, a body would have its maximum emission at a wavelength of 0.2897/298 centimeters, or 9.72 micrometers (microns), at a temperature of 298K or room temperature. It is well known from experience that a body at about 700° Centigrade normally is beginning to be hot enough to be visible with a dull red color and that at a temperature of approximately 900° to 1000° Centigrade, a body looks reddish to orange. The range of response of the human eye to visible light is about 0.7 microns in the red to 0.4 microns in the violet. At 700° Centigrade, or 973K, the maximum intensity would occur at 0.2897/973 centimeters, or 2.9 microns. At 1000° Centigrade, the maximum intensity has shifted to 0.2897/1273 centimeters, or 2.28 microns. Thus our material exhibits the exclusion of light in a range which can be estimated as extending from a few microns to the red portion of the spectrum, which is exactly what a photonic band gap material in the near infrared to the visible should do.

In the present invention, a material which operates in the near infrared and the visible as a photonic band gap material has been discovered. None of the difficulties presented in the literature regarding the fabrication of the material are impediments to its fabrication by the method and means we have discovered. A significant improvement in the ease and speed of fabrication has resulted.

The general purpose of this invention is to provide a photonic band gap material and the method and means for its fabrication, which has all of the advantages of similarly employed technology and has none of the above described disadvantages. To attain this, the present invention provides a unique class of photonic band gap material, and method and means for its fabrication.

An object of the instant invention is to provide method and means of construction of a photonic band gap material which has all of the advantages of similarly employed technology and has none of the above described disadvantages. To attain this, the present invention provides a unique method and means of constructing a photonic band gap material.

Another object of the instant invention is to provide method and means of construction of a photonic band gap material which permits the fabrication of a photonic band gap material which is itself composed of reticulated single crystal material.

Yet another object of the instant invention is to provide method and means of construction of a photonic band gap material which permits the fabrication of a photonic band gap material which is composed of a reticulated doped material.

Still another object of the instant invention is to provide method and means of construction of a photonic band gap material which permits the fabrication of a photonic band gap material which has pores of predetermined sizes over a wide range of sizes, from approximately 200 microns to approximately 1 micron or less.

It is another object of the instant invention to provide method and means of construction of a photonic band gap material which has a multiplicity of pore sizes in selected and distinct regions of its structure.

It is still another object of the instant invention to provide method and means of construction of a photonic band gap material which can be physically small or large in size, ranging from external dimensions of less than a millimeter to greater than centimeters, and perhaps as large as multiple tens of centimeters.

It is still a further object of the instant invention to provide method and means of construction of a photonic band gap material which can be infiltrated with a second, dissimilar material having a different dielectric constant.

It is yet another object of the instant invention to provide method and means of construction of a photonic band gap material which operates in the infrared region of the electromagnetic spectrum.

It is still yet another object of the instant invention to provide method and means of construction of a photonic band gap material which operates in the visible region of the electromagnetic spectrum.

It is still yet another object of the instant invention to provide method and means of construction of a photonic band gap material which operates in the ultraviolet region of the electromagnetic spectrum.

These and other objects and features of the present invention will be apparent to those skilled in the art from the following descriptions of specific embodiments of the invention taken in conjunction with the figures.

BRIEF DESCRIPTION OF THE DRAWINGS

Other objects and many of the attendant advantages of this invention will be readily appreciated as the same becomes better understood by reference to the following detailed description when considered in connection with the accompanying drawing, in which like reference numerals designate like parts throughout the figures thereof and wherein.

DETAILED DESCRIPTION OF THE PREFERRED EMBODIMENTS

Figure 1:
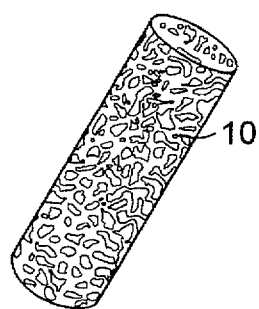
FIG. 1 is a perspective view of the porous single crystal photonic band gap material embodying the present invention.

Referring to FIG. 1, the photonic band gap material is comprised of a reticulated solid 10 which forms a cylinder. In FIG. 1, the solid portion of the photonic band gap material is shown in black., and the voids in the photonic band gap material, which extend substantially and continuously throughout the body of the photonic band gap material, are shown in white. The photonic band gap material may be a high dielectric constant substance, such as aluminum oxide or sapphire, other oxides such as ruby (chromium-doped aluminum oxide), yttrium aluminum garnet (YAG) or other similar synthetic garnets, semiconductors such as elemental silicon, germanium and the like, semiconductors formed as compounds from columns III and V of the periodic table such as gallium arsenide, indium phosphide, and similar compound semiconductors or ternary or higher order alloys of these semiconductors, such as gallium aluminum arsenide, semiconductors formed as compounds from columns II and VI of the periodic table such as zinc selenide, zinc sulphide, cadmium telluride, mercury telluride and similar compound semiconductors or ternary or higher order alloys of these semiconductors, such as mercury cadmium telluride, or materials having high dielectric constant which can be infiltrated into a porous body and then solidified, such as epoxies. The solid is shown as a cylinder simply because this geometry is a convenient one for use in a conventional optical system involving the propagation of collimated light beams. As will become apparent from the description of the fabrication of the solid, other geometrical forms can readily be fabricated. The pores in the reticulated solid are all of approximately the same size, and are defined by the process used to generate the reticulated solid.

The photonic band gap material of the present invention may be constructed as follows. In the most general case, a fluid, which may be a liquid or a gas, is infiltrated into a template solid having substantially continuous porosity throughout its extent, the fluid is solidified, and the template solid is removed, leaving a new solid having its solid members substantially in the positions of the continuous porosity of the template solid and having its pores in the positions of the solid members of the template solid.

Figure 2:
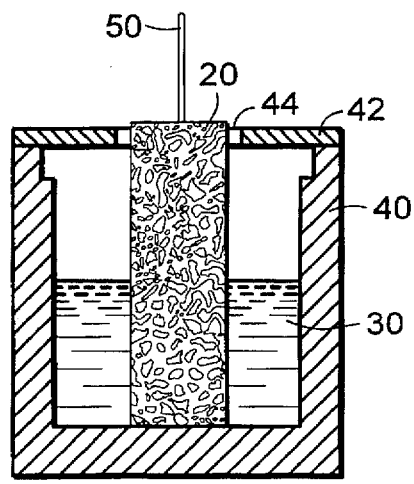
FIG. 2 is a cutaway sectional view taken through the growth station used to prepare the photonic band gap material embodying the method and means of the present invention, wherein infiltration of photonic band gap material from a liquid source into a template solid takes place.

In one preferred embodiment, shown in FIG. 2, a template solid 20, composed of a high melting metal which is substantially nonreactive with the photonic band gap material in its liquid form, which may be tungsten, is fabricated into the geometrical shape of substantially the size and shape of the desired photonic band gap material. In FIG. 2 the template solid 20 is shown with its solid portion shown in white, and the voids in the template solid 20, which extend substantially and continuously throughout its volume, are shown in black. The template solid 20 is itself a reticulated solid, having continuous pores and solid members composed-of the same kind of metal. The template solid 20 may be produced either from a specialty material with continuous porosity having controlled pore size in the range of approximately 1 to approximately 200 microns, or from an assemblage of individual pieces such as wires in the form of bundles or in the form of woven mesh which are held together by being bound with wire or by welding at selected points, or from a combination of such parts, or from any other substantially permeable structure. The template solid 20 is then immersed in a liquid body 30 composed of the molten form of the photonic band gap material, which may be molten aluminum oxide, which liquid is retained in a crucible 40 which may be made of solid molybdenum, and which has a lid 42 which may be mad of solid molybdenum and which is large enough to extend to the outer edges of the crucible 40 and which is supported thereby, and which has at least one opening 44 through which the template solid 20 may be inserted or removed from the crucible 20 and through which the template solid 20 may protrude and which is sufficiently large so that there is substantially no contact between the template solid 20 and the lid 42. The thermal power required for melting and maintaining the photonic band gap material as liquid 30 and for heating the template body 20 and the molybdenum crucible 40 is provided by an electric heater means, not shown, which may be resistance heating or radio frequency induction heating, and is not critical. A vessel, not shown, to maintain the liquid 30, template solid 20, and crucible 40 in an inert gas environment such as purified argon is present. A source of purified argon, not shown, is present. After the crucible 40 is charged with solid of a composition suitable to produce the desired photonic band gap material from the liquid melt 30, the template solid 20 is inserted into the crucible 40. Argon purge gas is admitted to the chamber for a time sufficient to displace the air initially in the chamber. The heater means is energized sufficiently to melt the charge but not so powerfully as to melt the crucible 40 or the template solid 20. The molten liquid 30 impregnates the template solid 20 by capillary action. If desired, an optional single crystal seed 50, composed of substantially the same solid composition as the desired photonic band gap material, may be brought into contact with the impregnated template solid 20. The electrical power is then slowly reduced, at a rate of 50° C. per hour, so as to permit the liquid 30 in the template solid 20 to solidify directionally from the seed into the template upon cooling below its melting temperature. The template solid 20 may also be raised slowly, at a rate of approximately 2.5 centimeters per hour, above the level of the liquid 30 by an elevator means, not shown, as the power is reduced or maintained, permitting energy to be lost preferentially from its top surface to the unheated chamber walls, not shown, and solidifying the photonic band gap material in the template solid 20 even as the liquid 30 remains molten. At the end of such cooling operation, and after contact between the template solid 20 and the excess liquid 30 has been lost, power may then be removed from the system. Other methods of infiltrating the template solid 20 such as melting a solid body, fiber, ingot, rod or the like of material that has the desired photonic band gap material composition so that the liquid produced flows into the template solid 20, or pouring the so produced liquid into the template solid 20, can also be used. The precise method of infiltration is not critical.

After the system is cooled to room temperature, the template solid 20 containing the photonic band gap material 10 is removed from the crucible 40. Excess liquid 30, if any, which has solidified outside the template solid 20 may be mechanically removed, by grinding if necessary. The template solid 20 is then chemically dissolved out from the photonic band gap material 10 by submersion in a solution of suitable chemical reagents maintained at 20° C., not shown, which may be held in a nonreactive vessel, not shown. In the case of producing a photonic band gap material 10 composed of reticulated aluminum oxide or sapphire, with a template solid 20 composed of tungsten, the solution may be aqueous hydrofluoric acid mixed with aqueous nitric acid and maintained at approximately 20° C.

In embodiments where the infiltrated fluid is fluid at room temperature, such as the case of a fluid consisting of an epoxy, the necessity to heat the fluid 30, the crucible 40, the lid 42, and the template solid 20 above room temperature is obviated, and no heating is required to be applied to form a fluid to carry out the process. Heating to cure the epoxy may or may not be applied at the discretion of the practitioner of the process

ALTERNATIVE EMBODIMENTS

Figure 3A:
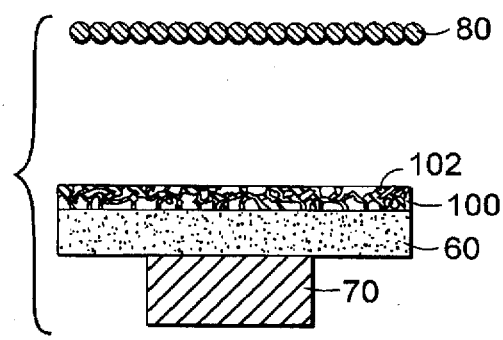
FIG. 3a is a cutaway sectional view taken through the growth station used to prepare the photonic band gap material embodying an alternative method and means of the present invention, wherein infiltration of photonic band gap material from a gaseous source into a template solid takes place with complete filling of the pores in the template solid.

The photonic band gap material of the present invention may be constructed alternatively as follows. For a material such as silicon which is a very aggressive solvent in its molten state, there may be few or no suitable template solid materials which can withstand the attack of the photonic band gap material in its molten or liquid state. Accordingly, a means of infiltration which avoids the presence of the photonic band gap material in its liquid state can prove advantageous For a material such as silicon, or for a compound semiconductor such as gallium arsenide, infiltration by deposition of the solid from a gaseous medium, as is practiced in the art of chemical vapor deposition, may be employed. Referring to FIG. 3a, a single crystal substrate 60, composed substantially of the same composition as the photonic band gap material which may be silicon, is placed upon a support 70, which may be a silicon carbide or graphite member. A heating means 80, which may be a plurality of tungsten halogen lamps or a radio frequency coil powered by a power supply 90, not shown, is disposed adjacent to the substrate 60 and the support 70, and can cause both to become heated to a controlled temperature, which is significantly below the melting point of the substrate and the photonic band gap material, which for silicon is 1410° C. A template solid 100 is placed upon the substrate. The template solid 100, which may be composed of tungsten or of sapphire, is a reticulated solid having substantially continuous pores of a predetermined average size, and may be fabricated in a manner similar to that recited above. Considering that one of the requirements for a photonic band gap material to interact appreciably with electromagnetic radiation is that the photonic band gap material have a thickness of approximately ten times the wavelength of the radiation of interest, for a photonic band gap material operating in the visible or the near infrared this dimensional requirement implies a thickness of at most several tens of microns and at least several microns. Deposited layers having these thicknesses are readily attained by chemical vapor deposition methods in practical lengths of time. Accordingly, the template solid 100 is prepared with a thickness of at least ten times the wavelength of the radiation for which the photonic band gap material is intended to operate. The infiltration with the photonic band gap material is then carried out by causing chemical vapor deposition to occur on the substrate 60 so as to infiltrate and envelop the template solid 100, by reacting gaseous species, provided from a source 110 not shown, containing the requisite chemical elements, which may be silicon, so as to deposit solid silicon 102 which may grow as a single crystal by epitaxy on the substrate 60. The infiltration so carried out permits the deposition of solid photonic band gap material in the continuous pores of the template solid 100 without formation of liquid photonic band gap material, but rather by the direct conversion of a gaseous species to a solid species. The deleterious interaction of liquid photonic band gap material with the template solid 100 is thus avoided. Upon completion of the deposition, the template solid 100, which may be tungsten, can be removed preferentially by oxidation in dry oxygen at a temperature of approximately 800° C., or by dissolution in a suitable liquid medium.

Figure 3B:
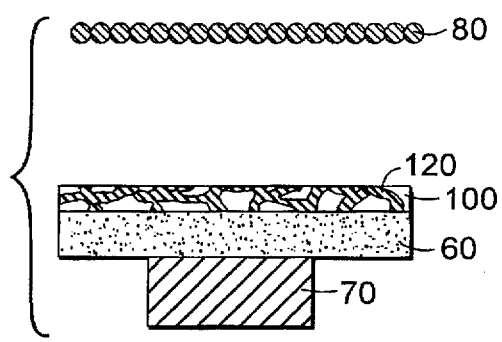
FIG. 3b is a cutaway sectional view taken through the growth station used to prepare the photonic band gap material embodying the alternative method and means of the present invention, wherein infiltration of photonic band gap material from a gaseous source into a template solid takes place with partial filling of the pores in the template solid.

Referring to FIG. 3b, which depicts a case where the template solid 100 is sapphire, deposition of silicon 120 in a quantity which is not sufficient to completely fill the pores may be carried out, and the template solid 100 may remain as a support for the silicon layer or overcoating so produced. The deposited silicon 120 may be introduced in such small quantity that the deposited silicon does not form a continuous coating on the sapphire template solid 100 but rather deposits as a number of discrete crystallites supported by the template solid 100, which is then not removed In the case where the photonic band gap material is silicon, the rate of oxidation of silicon in dry oxygen at 800° C. is less than 400 Angstroms per hour, while the rate of oxidation of tungsten, and the vapor pressure of its oxide, are high. Clearly, other materials may be suitable as template solids 100 for still other solids which may be deposited thereon by chemical vapor deposition technology.

The deposition of material within the pores of the reticulated template solid 100 may also be used as a means of controlling the pore size within the reticulated solid. The pores in the template solid 100 can be measured, for example by examination in an electron microscope, and a desired thickness of deposited solid can then be added to the template solid 100 by control of the duration and conditions, such as temperature and gas pressures, in the chemical vapor deposition process. By such a controlled addition of a known amount of material, one can produce a pore size of known dimension.

Figure 4:
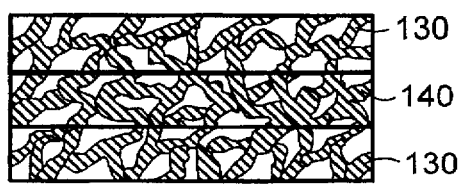
FIG. 4 is a sectional view taken through a rectangular slab of photonic band gap material composed of three planar regions, the two outermost regions having one composition of matter, and the third central region having a different composition of matter, which is fabricated as a single continuous object.

Referring to FIG. 4, yet another modification which may be practiced is the fabrication of a composite structure by the building up of segments composed of discrete materials.

As one example, one can begin with three template solid objects, which for illustration may be rectangular plates. Two of the template solids may be infiltrated with the same material 130, for example infiltrating liquid sapphire into tungsten template solids, and solidifying the sapphire in reticulated single crystal form. These two infiltrated solids may then be placed in intimate contact on either side of the third template solid, and held together by any convenient mechanical means such as binding with tungsten wire, or by spot welding, thereby forming a three-layered structure, and an infiltration with chromium-doped liquid sapphire 140 may be carried out. Since the two outside template solids are already filled, there will be no tendency for capillary action to cause any motion of liquid within those template solids. Capillary action will cause the center template solid, which was not previously-infiltrated, to be infiltrated with the chromium-doped liquid sapphire 140, which upon solidification and removal of the template solids as previously recited results in a monolithic reticulated single crystal structure having sapphire layers 130 on its outermost surfaces and reticulated chromium-doped sapphire (ruby) 140 in a central layer between the two sapphire layers. Alternatively, one could first infiltrate the central template solid with chromium-doped sapphire (ruby) 140, and then add the two outside template solids and repeat the infiltration using undoped sapphire 130 to produce the equivalent structure. It is not obvious to us how such a structure could be produced by a subtractive technique such as that of Yablonovitch, as the monolithic rectangular base material from which such a structure might be machined, consisting of a chromium-doped sapphire portion sandwiched between two undoped sapphire layers, is not readily fabricated in single crystal form. Clearly, the example of a flat geometrical shape having three regions is merely given for the purpose of illustrating how the technique may be carried out. It is equally possible to conduct such a process on other geometrical shapes which can be fabricated by joining a plurality of template solids, which may be shaped in any fashion desired, and which may be assembled by infiltrating selected segments, adding additional template solid segments, for example by binding, and repeating the infiltration for the added segments with liquids produce different solids in the added segments as compared to that infiltrated into the predecessor segments. As an example of a second geometry, we consider a series of cylindrical template solids, one of which is a right circular cylinder which forms the core, and the others a series of right circular cylindrical tubes of increasing internal diameter, each machined to fit in intimate contact with the external diameter of the cylinder that it may surround by being slid onto as a sheath. Clearly the process of adding segments and performing additional infiltrations can be repeated a plurality of times, and the removal of the template solid may be carried out by dissolution as long as its structure remains continuous to some surface of the object. If necessary, one or more surface machining steps may be carried out at intermediate points in the assembly process to remove excess infiltrated solid which extends beyond the physical dimensions of the template solid so as to make the segments fit together properly as originally designed, and so as to make the template solid accessible on some surface. It is be no means clear how Yablonovitch would generate the monolithic solid required to fabricate cylindrical objects having a plurality of compositions. Clearly, yet other geometries, such as a three dimensional solid composed of for example regular polyhedra, each placed in intimate contact with its fellows, and fabricated by a plurality of alternating infiltrations and additions of further template solid segments, with mechanical removal of excess infiltrated solid as required, can be envisioned.

As a second example, it is known that one can deposit by chemical vapor deposition a series of compositions which can differ in doping or even in chemical composition, as for example alternate layers of GaAs and $Al_{1-x}Ga_xAs$. By practicing such chemical vapor deposition on a reticulated template solid 100 such as in FIG. 3, one can build up a structure having regions of differing doping, or regions having different composition, or regions which differ in both doping and composition, which may then be capable of operation as electronic generators or detectors of electromagnetic radiation, such as light emitting diodes or photo diodes, if appropriate electrical contacts are made to them.

The possibility of performing a plurality of repetitions of introductions of template solids followed by additional chemical vapor deposition steps so as to build up a structure of some desired geometry is also clearly recognized, in analogy to the discussion above regarding fabrication of structures by the use of repeated liquid infiltration and addition of further segments of template solid.

An example is presented which demonstrates the efficacy of the present photonic band gap material as compared to the previous invention of Yablonovitch et. al. Yablonovitch teaches that the photonic band gap material produced by removing material from a single slab of dielectric material may operate in the microwave region of the electromagnetic spectrum. He further teaches that the same construction method, appropriately reduced in size, as for example by using reactive ion etching, may possibly permit operation in the visible, but to date he has not reported any such behavior. He states, however, in Physical Review Letters volume 63, page 1950, dated 30 Oct. 1989, that "In the absence of any further theoretical guidance, we adopted an empirical, Edisonian approach. Literally, we used the cut-and-try method. Dozens of fcc structures were painstakingly machined out of low-loss dielectric materials."

We further recognize that the photonic band gap material that we have produced can be tuned to operate with electromagnetic radiation in distinct portions of the electromagnetic spectrum by at least three methods, which modify or control the physical dimensions of the photonic band gap material. One tuning method is based on the physical dimensions of the pores and solid elements that make up the reticulated photonic band gap material as it is inherently produced. Control of such dimensions is clearly a feature of our fabrication method, either by liquid or gaseous infiltration in to a template solid having predetermined pore sizes, or by subsequent control of the thickness of deposition of solid by gaseous infiltration in a chemical vapor deposition process. A second method and means of controlling such mechanical dimensions of the photonic band gap material is the application (or removal) of thermal energy to modify the dimensions of the pores and solid elements of the material by virtue of the thermal expansion coefficient of the material, in which maintaining the material at a deliberately chosen temperature will cause a consequential predictable increase or diminution of the dimensions of the material through the action of the thermal expansion coefficient. A third method and means of controlling the mechanical dimensions of the photonic band gap material is the deliberate application of mechanical force or pressure to selected free surfaces of the photonic band gap material, to modify the dimensions of the pores and solid elements of the photonic band gap material by the effects of the compressibility of the material from which the photonic band gap material is constructed, in which application of a mechanical force or pressure to selected free surfaces of the photonic band gap material leads to reproducible mechanical distortions of the photonic band gap material, in a manner similar to the distortions that a spring exhibits when mechanical forces of compression or tension are applied to its ends, thereby changing its mechanical dimensions. Clearly, any other method of introducing a deliberate change in the dimensions of the photonic band gap material, such as electrostriction, or magnetostriction, if the material can support such a method, would work equally well as a means of tuning the material to respond in a selected region of the electromagnetic spectrum. We envision the possibility of dynamically tuning the photonic band gap material, either for continuous use at a particular range of frequencies or wavelengths in analogy to analog electronic technology, wherein the photonic band gap material operates in a continuous manner with some proportion to the intensity or value of the electromagnetic radiation, or to permit the modulation of such a use in analogy to digital electronic technology, wherein the photonic band gap material can be made to switch its behavior on and off with regard to a particular range of frequencies or wavelengths.

Beginning with the first photonic band gap material built according to our discoveries, we found that we could observe optical behavior in the visible. We can further point out that using our fabrication methods, we can for example produce a monolithic photonic band gap material having larger pores in its interior and smaller ones in its exterior by the simple expedient of stacking template solids together having the requisite dimensions in any order we choose. Yablonovitch does not have a mechanism to fabricate such a device or structure by his cutting method alone.

Obviously many modifications and variations of the present invention are possible in light of the above teachings. The photonic band gap material, and its fabrication procedures described herein provide a photonic band gap material which functions in the near infrared and visible portions of the electromagnetic spectrum. Other techniques for applying the present invention may be employed and changes made in regard to some of the details and still provide a photonic band gap material without deviating from the spirit and scope of the invention specified herein.

What is claimed is:

1. Modification of a photonic band gap behavior of a photonic band gap material by modification of a physical periodicity or a dielectric constant or both of the said photonic band gap material by application of one or more of the excitations chosen from the group comprising:

a. a thermal excitation, b. a physical compression or extension, c. an electric field excitation, and d. a magnetic field excitation, or by the addition of the same or other photonic band gap material so as to modify the physical periodicity of the said photonic band gap material.

\* \* \* \* \*